United States Patent Office 3,476,624

Patented Nov. 4, 1969

3,476,624
PROCESS OF ETCHING COPPER CIRCUITS

Bernard J. Hogya, Sayreville, N.J., and William J. Tillis, King of Prussia, Pa., assignors to FMC Corporation, New York, N.Y., a corporation of Delaware No Drawing. Filed Feb. 8, 1966, Ser. No. 525,840
Int. Cl. C23f *1/02;* C09k *3/00*
U.S. Cl. 156—13 10 Claims

ABSTRACT OF THE DISCLOSURE

Copper bearing a tin-lead solder resist is etched with an aqueous peroxydisulfate solution without undue harmful attack on the solder resist. A tin-lead solder resist is provided as a pattern on the copper object and the resulting workpiece is etched with an aqueous solution containing from 5% by weight to its solubility limit of a peroxydisulfate and 0.5% to 15% by weight of phosphoric acid at a temperature of 50° to 150° F. The phosphoric acid overcomes the problem of attack of persulfate on solder.

This invention relates to the etching of copper bearing a tin-lead alloy solder resist, and more particularly to the etching of copper bearing such a resist by a method which avoids harmful attack on the resist.

Methods have been developed for selectively dissolving or etching copper in the production of electrical printed circuits, printing plate or other products having predetermined raised portions or reliefs of copper metal. In the production of printed circuits, for example, copper foil is laminated to a plastic sheet or to a fiber sheet impregnated with a bonding material such as a phenolic resin and is masked with a resist material in areas which later become the circuit, and the copper foil in unmasked areas is subjected to attack by an etchant, preferably an aqueous peroxydisulfate solution. The resist material, frequently an ink, a wax or a photographically developed image, is not attacked by the etchant and accordingly the copper is dissolved preferentially in areas not coated by the resist. This produces a copper-resist network having the design of the electrical circuit from which the resist may be removed if desired.

The copper relief provided by this means, as indicated, may form an electrical circuit or other design which must be connected to other portions of the circuit or design, or to other objects. In order to facilitate such connection it has become fairly common practice to employ a tin-lead solder as the resist, leaving the resist on the circuit after etching so that electrical or other connections can be made by a soldering operation. Thus, the solder is plated onto the copper in the area it is desired to retain as the relief, or circuit, area and upon etching of the copper with a peroxydisulfate the solder remains on the surface of the relief; it serves not only as a resist during etching but also as an excellent solder-connection means.

The use of solder as a resist, however, has led to some severe problems. During etching of copper bearing the solder resist, the solder is attacked slightly by the peroxydisulfate, and the products of reaction remain on the solder, both discoloring it and interfering with subsequent soldering of it, for example to other components of an electrical circuit. Furthermore, these byproducts run onto the copper being etched, thereby interfering with the etching, providing either nonuniform or incomplete etching.

It therefore is an object of our invention to provide an improved method of etching copper bearing a solder resist employing a peroxydisulfate, which minimizes the usual attack of the peroxydisulfate on the solder, thereby avoiding the noted deleterious effects caused by such attack.

We have now found that by etching a tin-lead solder-resist copper with an aqueous peroxydisulfate solution consisting essentially of a peroxydisulfate of ammonium, sodium, lithium, barium, strontium or potassium, which solution contains about 0.5% to 15%, and preferably 1.0% to 4.5%, by weight of the total solution of phosphoric acid and from about 5% by weight to its solubility limit of the peroxydisulfate, at a temperature of about 50° to 150° F. until the copper has been etched in areas free of the resist, we avoid harmful attack on the solder by the peroxydisulfate.

The simple expedient of providing a small amount of phosphoric acid in the peroxydisulfate etching solution quite markedly and unexpectedly improves both the quality of the etch being conducted and the quality of the product. When other acids such as sulfuric acid are employed in place of the phosphoric acid, the solder attack problem is not adequately resolved, and the etched product and solder resist are both discolored and affected in a manner which interferes with subsequent soldering applications.

Typical copper etching operations in accordance with our invention are conducted on copper foil, 0.0014 to 0.0050 inch in thickness, carried on a backing material such as a resin-bonded fiber sheet or other backing material. Other forms of copper may be etched by our process, as for example, sheets or blocks of the metal in preparation of printing plates, decorative items and the like, where a solder facing on the relief left after etching is desired.

The tin-lead solder is deposited on the copper in the form a solder normally containing about 55% to 70%, and preferably 60% to 63%, by weight of tin and the balance substantially lead. Small amounts of other metals may be included in the tin-lead alloy; however, in selecting such additives they obviously should be selected to avoid those which decompose peroxydisulfate excessively.

In producing a tin-lead solder plate, for example, a 0.00001 to 0.05 inch thick plate by electroplating, the aqueous plating solution contains a total of about 60 g. of tin per liter, about 55 g. of this being stannous tin, along with about 25 g. of lead and 100 g. of free fluoboric acid per liter, 25 g. of boric acid per liter and 5 g. of meat peptone per liter. The anodes employed with this solution are composed of 60% tin and 40% lead. A cathode current density of about 30 amps/sq. ft. and a temperature of about 60° to 100° F. are employed in the plating, and the solution is agitated mechanically. The anode to cathode area ratio is about 2 to 1. The solder plate can be provided by alternate means, for example by electroless plating, dipping the workpiece into a molten solder bath or the like.

The aqueous etching solution employed to each copper bearing the tin-lead alloy solder resist contains about 5% to its solubility limit, and preferably about 5 to 25%, of an ammonium, sodium, potassium, barium, lithium, or strontium peroxydisulfate, and the herein amount of about 0.5% to 15%, and preferably 1.0% to 4.5%, by weight of orthophosphoric acid. The phosphoric acid in the solution is orthophosphoric acid. However, it may be introduced as the polyacids, e.g., pyrophosphoric or superphosphoric acid and the like, which in the herein solutions form the orthophosphoric acid. The preferred peroxydisulfate for use in this process is ammonium peroxydisulfate. In order to speed the rate of etching about 5 parts per million of mercuric chloride or other mercuric salt may be added to the solution as a dissolution catalyst. These solutions are well known in the art. For example the use of ammonium or other peroxydisulfate solutions catalyzed with mercuric chloride or other catalysts for copper dissolution is described fully in U.S. Patent 2,978,301.

The effect of the phosphoric acid in the etching bath is described herein in terms of the character of the solder surface following etching. Spottiness of the solder surface, and change from its original very light grey color, demonstrate attack and damage to the surface. Damaged surfaces have an uneven and unattractive appearance and do not solder as well as clean uniform solder surfaces.

Furthermore, spottiness indicates that the solder surface has reacted with the etch bath, and unetched copper adjacent the solder-resist indicates that the products of reaction of solder with etchant have run onto the copper surface during etching, thereby interfering with etching. Generally speaking, the worse the appearance of the solder surface, the worse the etching. In some cases it may be desired to improve even the solder surface left after etching with the solutions of our invention. In such cases a brief dip in a 10% mineral acid solution, preferably hydrochloric acid, renders the solder even more susceptible to being soldered. Solder surfaces resulting from etching of the resist-carrying copper object in a peroxydisulfate solution not containing phosphoric acid, on the other hand, cannot be so simply rendered solderable.

The following examples are provided by way of illustration of our invention only, and are not to be deemed as limiting the scope thereof in any way.

Example 1

Copper foils measuring 0.0014 inch in thickness were bonded to glass-fiber-containing phenol formaldehyde backing sheets and tin-lead solder plates (60% tin, 40% lead by weight) 0.001 inch thick were deposited onto the copper foil surfaces in areas representing a desired electrical circuit. This solder deposit served as a resist. In depositing the solder wax was employed as a masking agent in areas to be left free of solder.

The surfaces were then treated to remove the wax masking agent in areas outside the desired circuit, and etched in an aqueous solution containing, by weight, 25% of ammonium peroxydisulfate, 5 p.p.m. of mercuric chloride and 2.25% of orthophosphoric acid, and the number of ounces of copper ion per gallon of etchant indicated in the table which follows. The copper was included to simulate conditions encountered in commercial operations. The etching was carried out at 100° F. Specimens were etched in a spray etcher having an 8 gallon capacity; a uniform spray distribution was provided by utilizing 8 spray nozzles which oscillated 15° in each direction from the horizontal.

Following etching the specimens were removed from the etching bath, rinsed with distilled water and observed. The results of the observations and details of the runs are shown in the following table.

disulfate solution used therein as an etchant provides etching results essentially comparable to those shown in Example 1. That is, the etch carried out in a solution containing our phosphoric acid additive in the herein amount of 1.5% to 15% results in solder-resist etched circuits having a uniform and clean appearance following etching, whereas carrying out the etch in the absence of phosphoric acid, either with or without added sulfuric acid, provides a product having an uneven and unattractive appearance. Use of an aqueous potassium peroxydisulfate solution containing about 5% of that material results in an etching rate about 1/4 as fast as the rate provided with ammonium peroxydisulfate.

It is seen from these examples that use of no acid in the ammonium peroxydisulfate etching bath, or use of sulfuric acid in such a bath, results in an etched copper circuit bearing a solder resist which is badly affected by the etching solution. Incorporation of the herein amount of 0.5% to 15% of phosphoric acid, on the other hand, provides an etched product whose solder resist is not harmfully affected by the treatment.

Pursuant to the requirements of the patent statutes, the principle of this invention has been explained and exemplified in a manner so that it can be readily practiced by those skilled in the art, such exemplification including what is considered to represent the best embodiment of the invention. However, it should be clearly understood that, within the scope of the appended claims, the invention may be practiced by those skilled in the art and having the benefit of this disclosure, otherwise than as specifically described and exemplified herein.

What is claimed is:

1. A method of etching copper bearing a tin-lead solder resist containing 55% to 70% by weight of tin and 45% to 30% by weight of lead with an aqueous peroxydisulfate solution without providing undue harmful attack on the solder resist, comprising providing said solder resist as a pattern on the surface of a metallic copper object, contacting the resulting workpiece with an aqueous solution containing from 5% by weight to its solubility limit of a peroxydisulfate from the group consisting of the ammonium, sodium, lithium, barium, strontium and potassium peroxydisulfates and 0.5% to 15% by weight of phosphoric acid at a temperature of 50° to 150° F. until the copper in areas free of said solder resist has been etched, and removing the resulting etched workpiece from said aqueous peroxydisulfate solution.

2. The method of claim 1 in which the phosphoric acid is present in the amount of 1.0% to 4.5% by weight.

3. The method of claim 1 in which the solder resist is a tin-lead solder containing by weight, 60% to 63% of tin and 40% to 37% of lead.

4. The method of claim 1 in which ammonium peroxydisulfate is employed as the peroxydisulfate.

5. The method of claim 1 in which sodium peroxydisulfate is employed as the peroxydisulfate.

TABLE.—ETCHING CHARACTERISTICS OF TIN-LEAD SOLDER-PLATED COPPER PRINTED CIRCUITS

| Type of Resist | Copper as percent of exposed area | Acid in Etching Bath | Amount of Cupric Ion in Etching Bath (oz. per gal.) | Appearance of tin-lead resist after etching |
|---|---|---|---|---|
| 1. 60% Tin-40% Lead | 65 | None (comparative example) | 3 | Mottled, dark gray-brown. |
| 2. do | 65 | 2.25% $H_3PO_4$ | 3 | Unmottled, light gray-shiny and clean. |
| 3. do | 65 | 2.25% Sulfuric acid (comparative example) | 3 | Mottled, dark gray-brown. |

Example 2

Use of aqueous solutions containing 20% of sodium peroxydisulfate, barium peroxydisulfate, strontium peroxydisulfate, and lithium peroxydisulfate, respectively in the process of Example 1 in place of the ammonium peroxy- 6. Method of claim 1 in which lithium peroxydisulfate is employed as the peroxydisulfate.

7. Method of claim 1 in which barium peroxydisulfate is employed as the peroxydisulfate.

8. Method of claim 1 in which strontium peroxydisulfate is employed as the peroxydisulfate.

9. Method of claim 1 in which potassium peroxydisulfate is employed as the peroxydisulfate.

10. Method of claim 1 in which the aqueous peroxydisulfate solution contains mercuric ions as a catalyst for copper etching.

References Cited

UNITED STATES PATENTS

| | | | |
|---|---|---|---|
| 2,678,876 | 5/1954 | Burnside | 252—79.1 |
| 2,978,301 | 4/1961 | Margulies et al. | 252—79.1 |

OTHER REFERENCES

IBM Technical Disclosure: Anodized Resists for Ammonium Persulfate by York, vol. 8, No. 7, December 1965, p. 937.

JACOB H. STEINBERG, Primary Examiner

U.S. Cl. X.R.

156—3, 18; 252—79.1